(12) United States Patent (10) Patent No.: US 9,293,400 B2
Ananiev (45) Date of Patent: Mar. 22, 2016

(54) PACKAGE WITH TERMINAL PINS WITH LATERAL REVERSAL POINT AND LATERALLY EXPOSED FREE END

(71) Applicant: Infineon Technologies AG, Neubiberg (DE)

(72) Inventor: Sergey Ananiev, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/590,021

(22) Filed: Jan. 6, 2015

(65) Prior Publication Data

US 2015/0194374 A1 Jul. 9, 2015

(30) Foreign Application Priority Data

Jan. 7, 2014 (DE) .................... 10 2014 100 110

(51) Int. Cl.
*H01L 23/495* (2006.01)
*H01L 25/065* (2006.01)
*H01L 23/00* (2006.01)
(Continued)

(52) U.S. Cl.
CPC .... *H01L 23/49575* (2013.01); *H01L 23/49555* (2013.01); *H05K 3/3426* (2013.01); *H01L 23/3121* (2013.01); *H01L 24/32* (2013.01); *H01L 24/48* (2013.01); *H01L 24/49* (2013.01); *H01L 24/50* (2013.01); *H01L 24/73* (2013.01); *H01L 2224/32013* (2013.01); *H01L 2224/32145* (2013.01); *H01L 2224/32245* (2013.01); *H01L 2224/48091* (2013.01); *H01L 2224/48096* (2013.01); *H01L 2224/48101* (2013.01); *H01L 2224/48106* (2013.01); *H01L 2224/48145* (2013.01); *H01L 2224/48247* (2013.01); *H01L 2224/73265* (2013.01); *H01L 2924/00014* (2013.01); *H01L 2924/13055* (2013.01);

(Continued)

(58) Field of Classification Search
None
See application file for complete search history.

(56) References Cited

U.S. PATENT DOCUMENTS 4,698,660 A * 10/1987 Kubota et al. .............. 257/696
5,157,480 A * 10/1992 McShane et al. .......... 257/693

(Continued)

FOREIGN PATENT DOCUMENTS

JP H02-249258 A 10/1990

OTHER PUBLICATIONS

Definition of align downloaded from URL< http://www.merriam-webster.com/dictionary/align> on Jul. 17, 2015.*

(Continued)

*Primary Examiner* — Joseph Schoenholtz (57) ABSTRACT

A package (120), wherein the package (120) has at least one electronic chip (124), an encapsulation body (138) that encapsulates the electronic chip(s) (124), and a plurality of terminal pins (122) to connect the electronic chip(s) (124), wherein each of the said terminal pins (122) has an encapsulated section (126), which is encapsulated at least partially by the encapsulation body (138) and has an exposed section (128) that protrudes from the encapsulation body (138), and wherein at least a portion of the exposed sections (128) laterally extends from the encapsulation body (138) up to a reversal point (130) and laterally extends back from the reversal point (130) to the encapsulation body (138), so that a free end (132) of the exposed sections (128) is laterally aligned with or to a corresponding side wall (134) of the encapsulation body (138) or is spaced from the corresponding side wall (134) of the encapsulation body (138) laterally outwardly.

23 Claims, 9 Drawing Sheets

(51) Int. Cl.
- *H01L 23/13* (2006.01)
- *H01L 21/56* (2006.01)
- *H01L 21/60* (2006.01)
- *H01L 23/31* (2006.01)
- *H05K 3/34* (2006.01)

(52) U.S. Cl.
CPC .............. *H05K2201/10757* (2013.01); *H05K 2201/10765* (2013.01); *H05K 2201/10772* (2013.01)

(56) References Cited

U.S. PATENT DOCUMENTS

| | | | | |
|---|---|---|---|---|
| 5,331,235 A * | 7/1994 | Chun | ............................. | 257/777 |
| 5,410,445 A * | 4/1995 | Kanetake | ...................... | 361/539 |
| 5,440,452 A * | 8/1995 | Kitahara | ........................ | 361/773 |
| 5,895,969 A * | 4/1999 | Masuda et al. | ................. | 257/696 |
| 6,114,759 A * | 9/2000 | Okuaki | .......................... | 257/692 |
| 6,201,297 B1 * | 3/2001 | Masuda | ......................... | 257/690 |
| 8,481,862 B2 * | 7/2013 | Pai et al. | ........................ | 174/260 |
| 2003/0062601 A1 * | 4/2003 | Harnden et al. | .............. | 257/666 |
| 2010/0302756 A1 * | 12/2010 | Otsuki | ........................... | 361/813 |
| 2013/0020695 A1 * | 1/2013 | Na et al. | ........................ | 257/696 |
| 2013/0322046 A1 * | 12/2013 | Otsuki | ........................... | 361/813 |

OTHER PUBLICATIONS

Package Dimensions downloaded from URL < https://www.ichaus.de/upload/pdf/Package%20dimensions%20MSOP,%20SSOP,%20TSSOP-A2.pdf> on Jul. 17, 2015.*

Examination report of Oct. 10, 2014 for couter-part German application 10 2014 100 110.9.

* cited by examiner

PACKAGE WITH TERMINAL PINS WITH LATERAL REVERSAL POINT AND LATERALLY EXPOSED FREE END

BACKGROUND

1. Field

Various embodiments generally relate to a package, an electronic device and a method for manufacturing a package.

2. Description of the Prior Art

Conventional packages for electronic chips contain mold compounds as an encapsulation body and are advanced in their development stage to such an extent that the package does not significantly limit the performance of electronic chips any longer. The electronic chips are externally connected to a peripheral electronic device, such as a printed circuit board, using terminal pins. The terminal pins extend beyond the encapsulation body and are soldered onto the peripheral electronic device. Exposed sections of the lines usually have a so-called gull wing configuration. J-shaped exposed sections of the terminal pins have been proposed for efficient use of the available space.

However, when a package is mounted on a peripheral electronic device and is operated under varying temperature conditions, the connection between the exposed section of the terminal pins and the electrical contacts at the peripheral electronic device can be adversely affected by mechanical stresses. This may affect the electronic performance and reliability.

ABSTRACT

There might be a need for a compact and flat package that is more failsafe even under varying temperature conditions.

An exemplary embodiment shows a package, which has at least one electronic chip, an encapsulation body that encapsulates the electronic chip(s) at least partially, and a plurality of terminal pins to connect the electronic chip(s) (for example, to a peripheral electronic device), wherein each of the said terminal pins has an encapsulated section, which is encapsulated by the encapsulation body and has an exposed section that protrudes from the encapsulation body, and wherein at least a portion of the exposed sections laterally extends from the encapsulation body up to a reversal point and laterally extends back from the reversal point to the encapsulation body, so that a free end of the exposed sections is laterally aligned with or to a corresponding side wall of the encapsulation body or is spaced from the corresponding side wall of the encapsulation body laterally outwardly.

Another exemplary embodiment shows an electronic device, which has a peripheral electronic device, which comprises a plurality of electrical contacts, and a package having the features mentioned above, wherein at least some of the terminal pins of the package are electrically connected to a corresponding one of the electrical contacts of the peripheral electronic device.

Yet another exemplary embodiment shows a method for producing a package, wherein a plurality of terminal pins (which may be formed, for example, for electrically contacting at least one electronic chip to a peripheral electronic device) are connected to at least one electronic chip, the electronic chip(s) is/are at least partially encapsulated by an encapsulation body and the terminal pins are partially encapsulated, such that each of the terminal pins has an encapsulated section that is encapsulated by the encapsulation body, and an exposed section that extends beyond the encapsulation body, wherein at least a portion of the exposed sections is configured such that these sections laterally extend from the encapsulation body up to a reversal point and laterally back from the reversal point towards the encapsulation body, so that a free end of the exposed sections is laterally aligned to or with respect to a corresponding side wall of the encapsulation body or spaced from a corresponding side wall of the encapsulation body laterally outwardly.

An exemplary embodiment has the advantage of providing a package which is more failsafe in the presence of a thermal mismatch between different components of the package with diverse response characteristics with respect to varying temperatures. Such a package concept is also completely compatible with a flat design, and a compact configuration, as is desirable in modern package technology. Due to different values of the coefficient of thermal expansion of various components of an electronic device from a package and a peripheral electronic device, on which the package is mounted (in particular, different coefficients of thermal expansion of the encapsulation body of the package and a carrier substrate of the peripheral electronic device), thermal alternation takes place between hot and cold operating conditions to a mismatch between a spatial terminal pin section at a boundary between an interior and an exterior of the encapsulation body on the one side and the encapsulation body on the other side. This can subsequently lead to mechanical stress on the electrical and mechanical interface between the terminal pin and the peripheral electronic device.

By configuring the exposed section of the terminal pin outside the encapsulation body such that this first extends radially outwardly and then, after a reversal point, extends back radially inwards, an increase in the effective beam length of the exposed section of the terminal pin can be achieved, which reduces the rigidity of the terminal pins and results in a significantly reduced mechanical stress that may occur at a transition between the free end of the terminal pin and an associated electrical contact of the peripheral electronic device. Therefore, even in the case of many cycles of thermal changes and large temperature differences in different operating modes of the electronic device, these can be safely (i.e. better than conventional approaches) protected from damage, in particular, at an interface between the package and the peripheral electronic device. Simultaneously, the increase in the effective beam length of the exposed sections of the terminal pins leads to an enlargement of the bonding surface between a lower surface of the exposed sections of the terminal pins adjacent to the free end on one side, and an upper surface of the electrical contacts of the peripheral electronic device on other side. This also strengthens the connection and improves the stability of the electronic device against undesirable damage to the electronic connection.

By preventing the free ends of the exposed sections of the terminal pins from protruding up to the bottom of the lower main surface of the encapsulation body, that is by preventing radially inward protrusion further than to a vertical line of alignment starting from the side wall of the encapsulation body, the free ends of the terminal pins are securely protected from an abutment against a lower main surface of the flat encapsulation body, for example, upon exposure to a compressive force during assembly. Using such sufficiently outwardly arranged free ends of the terminal pins, the spring-like properties of the terminal pins can act freely. At the same time, a compact design of the package can be realized in a vertical direction because the compression of the terminal pins during mounting is not limited by abutting the free ends of the exposed sections against the encapsulation body.

DESCRIPTION OF OTHER EXEMPLARY EMBODIMENTS

In the context of the present invention, the term "a free end of the exposed sections is spaced from a respective side wall of the encapsulation body laterally outwardly" may particularly denote that the part of the exposed section, which extends back radially inside from the reversal point, does not extend so far that the free end would be located below a lower main surface of the encapsulation body. In contrast, according to the option described, a lateral gap remains between the free end of the exposed section of the terminal pin and the lateral side wall of the encapsulation body.

In the context of the present application, the term "a free end of the exposed sections is laterally aligned with or to a corresponding side wall of the encapsulation body" may particularly denote that the free end of the terminal pin is aligned with the side wall of the encapsulation body or extends up to it, when the package is seen from the top. Through this configuration, it can also be assured that when bending or compressing, the section of the terminal pin that is immediately adjacent the free end, does not abut against the lower surface of the encapsulation body, and therefore, the compactness of the arrangement is not limited in an advantageous manner.

Furthermore, other exemplary embodiments of the package, the arrangement and method are described.

According to one exemplary embodiment, the exposed sections are configured such that their respective extension from the reversal point up to the free end ends such that it is impossible for the exposed sections to extend up to the bottom or even up to a lower main surface of the encapsulation body. By mechanically preventing the free end abutting against the lower surface of the encapsulation body, a high degree of compression, and therefore an increase in the compactness of the package can be achieved when it is mounted on the peripheral electronic device.

According to one exemplary embodiment, the terminal pins are configured such that the free end of the exposed sections is spaced vertically with respect to a lower surface of the encapsulation body if no force (such as a compressive force, which is generated while mounting the terminal pins on the electrical contacts) acts on the package. This also makes it possible to obtain a compact arrangement by bending, for instance, the spring-like connecting pin in a vertical direction while mounting the package on the peripheral electronic device.

According to one exemplary embodiment, an entire outer surface of the exposed sections, which is turned away from the encapsulation body may be convex. Therefore, the terminal pins can be protected from inadvertently being entangled with other components or from being in undesirable interaction otherwise, for example during the installation procedure. In a corresponding manner, an entire inner surface of the exposed sections that faces the encapsulation body may be concave.

According to one exemplary embodiment, the terminal pins are configured such that a (in particular, maximum) vertical distance between the section of the exposed sections that extends laterally from the encapsulation body up to the reversal point and its other sections that laterally extend from the reversal point back towards the encapsulation body is reduced by the action of a compressive force during assembly of the package on the peripheral electronic device. Thus, the terminal pins may be configured to respond to a compressive force perpendicular to both opposite main surfaces of the encapsulation body—like a spring having a restoring force.

Figure 1:
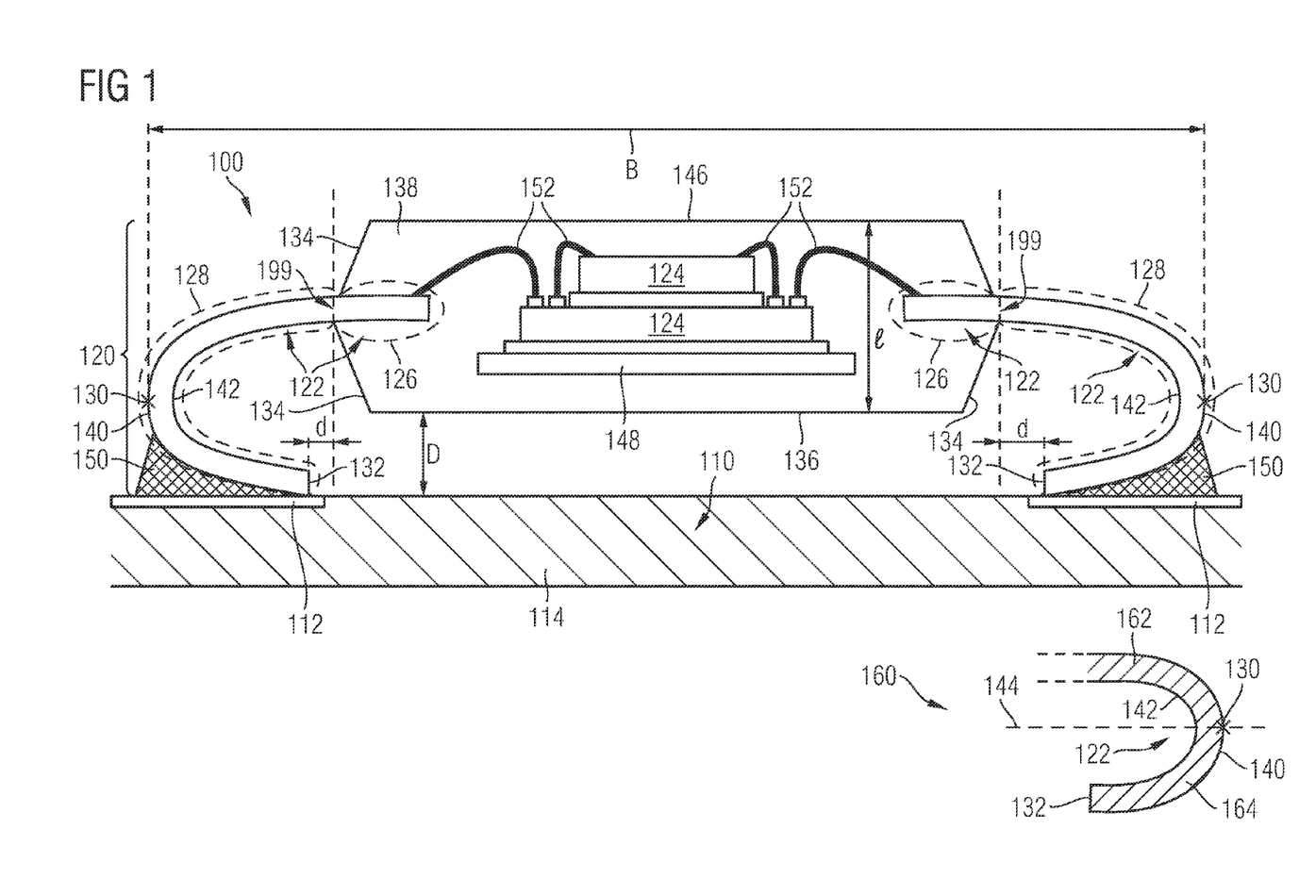
FIG. 1 is a cross-sectional view of an electronic device according to an exemplary embodiment, comprising a peripheral electronic device and a package that is mounted on it.

According to one exemplary embodiment, a part of the exposed sections that extends laterally up to the reversal point may be axially symmetrical to a different part of the exposed sections that laterally extends from the reversal point back towards the encapsulation body, namely with respect to an axis of symmetry or plane of symmetry that is in a plane parallel to the opposite main surfaces of the encapsulation body (see, for example, detail 160 in FIG. 1).

According to one exemplary embodiment, at least a part of the exposed section is substantially C-shaped, i.e. it comprises a structure or consists of a structure that has approximately the shape of the letter "C", if this is viewed as such, or upside down. Such a configuration is shown, for example in FIG. 1. A C-shaped configuration can easily be produced by bending a wire-like or ribbon-like semi-finished product for forming the terminal pins.

According to one exemplary embodiment, at least a part of the exposed sections may extend from the lateral side wall of the encapsulation body. The exposed sections may also extend from a lower main surface or from a lower main surface of the encapsulation body.

According to one exemplary embodiment, the exposed sections of the terminal pins extend from all four lateral sides of the encapsulation body beyond the encapsulation body. In a top view, the encapsulation body may have the shape of a rectangle, for example, a square. If groups of parallel terminal pins extend from all four sides of a rectangle, the given space can be efficiently used for generating multiple terminal pin connections. This adds to the compactness of the arrangement.

According to one exemplary embodiment, a ratio between a lateral extension of the package and a thickness of the package is around five, in particular, around nine. Therefore, very flat packages can be formed with the package architecture according to the exemplary embodiments.

In one exemplary embodiment, the package is configured as a flat package. In particular, a thickness of the package (in an unmounted state) is less than about 1.7 mm.

In particular, the package can be configured as a quad flat package (QFP). A quad flat package can be used as a surface-mounted, built-in switching circuit package viewed with the terminal pins described above, which extend from each of the four sides of the encapsulation body. For instance, 32-304 terminal pins may be appropriate, and a pitch width may be in a range between 0.4 mm and 1.0 mm. For example, the quad flat package can be configured as a thin quad flat package, a bumpered quad flat package, a ceramic quad flat package, a fine pitch quad flat package, a heat sinked quad flat package, a low profile quad flat package, a metric quad flat package, a plastic quad flat package, a small quad flat package, a very small quad flat package or a very thin quad flat package.

According to one exemplary embodiment, the terminal pins may have a shape that is selected from a group consisting of a bent wire (that may have, for example, a point-like cross-section or a circular cross-section) and a curved tape (that may have, for example a linear cross-section or a different elongated cross-section). If a bent wire is used, it may form a substantially one-dimensional connecting line with the electrical contact of the peripheral electronic device. If a bent wire is used, it may form a substantially two-dimensional, flat connecting area with the electrical contact of the peripheral electronic device. The material and/or the dimensions of the terminal pins may be specifically configured to accurately set the local elasticity and rigidity properties.

According to one exemplary embodiment, the electronic chip(s) may be mounted on a chip carrier (partially or completely within the encapsulation body), in particular, on a lead frame. The electronic chip(s) may be electronically coupled with the terminal pins through bonding wires. The leadframe or other chip carrier may also be at least partially encapsulated by the encapsulation body. The leadframe acts as a mechanical support for the electronic chip during its assembly. It may have a chip paddle, on which the electronic chip is mounted, and terminal pins, which establish an external electrical connection to the outer world. The electronic chip can be connected to the terminal pins using bonding wires by wire bonding or tape automated bonding.

According to an exemplary embodiment, the terminal pins that partially protrude from the encapsulation body can form at least a portion of the lead frame that supports the electronic chip. In another exemplary embodiment, the terminal pins can be provided, separated from the lead frame. However, it should be noted that any other arbitrary chip carrier which is different from a lead frame, can also be used for mounting the electronic chip(s).

In one exemplary embodiment, the bottom surfaces of the exposed sections are soldered or sintered to the electrical contacts. The stability of the solder or sintered bond between the exposed section of the terminal pins and the electrical contacts of the peripheral electronic device can be strengthened by the above-described configuration of the exposed sections of the terminal pins, so as to withstand mechanical stresses that can occur during thermal cycling.

According to one exemplary embodiment, the peripheral electronic device is configured as a PCB (Printed Circuit Board). However, other electronic mounting bases can also be used to mount the package on it.

According to one exemplary embodiment, a material of the encapsulation body may have a larger (for example, a larger average or effective) coefficient of thermal expansion than a material of the peripheral electronic device. Specifically, in this scenario, the configuration of the exposed sections with the first partial section that extends from the encapsulation body up to the reversal point and the second section that extends back from the reversal point such that it approaches the encapsulation body again (but does not reach it), is capable of withstanding the type of mechanical stress that is associated with the values of the coefficient of thermal expansion without any damage. An example in which this condition is met is the use of plastic material as a molding compound for forming the encapsulation body in combination with the use of FR4 as the base material of a printed circuit board as a peripheral electronic device.

According to one exemplary embodiment, the electronic chips can be used as sensors or actuators in micro-electromechanical systems (MEMS), for example, as pressure sensors or accelerometers. In another exemplary embodiment, the electronic chip can be used as semiconductor chips for power applications, for example automotive applications, and may include, for example at least a built-in insulated gate bipolar transistor (IGBT) and/or at least a built-in diode. According to one exemplary embodiment, the electronic chip(s) may be a logic IC or an electronic chip for high-frequency power connections.

A semiconductor substrate, preferably a silicon substrate may be used as a substrate or wafer to form the electronic chip. Silicon oxide or another electrically insulating substrate may also be used. It is also possible to use a germanium substrate or a III-V semiconductor material. For example, exemplary embodiments may be implemented in gallium nitride or silicon carbide technology. A plastic material or a ceramic material can be used for the packaging, molding or encapsulation, for instance. Furthermore, exemplary embodiments may use standardized semiconductor process technologies such as, suitable etching technology (comprising isotropic and anisotropic etching, in particular, plasma etching, dry etching and wet etching), structuring technology (which may involve lithographic masks) and/or deposition technologies (such as chemical vapor deposition (CVD), plasma enhanced chemical vapor deposition (PECVD), atomic layer deposition (ALD), sputtering, etc.).

The above and other targets, features and advantages will become more apparent from the following description and the appended patent claims, when they are viewed in conjunction with the accompanying drawings, in which corresponding parts or elements are provided with corresponding reference signs.

BRIEF DESCRIPTION OF THE FIGURES

Exemplary embodiments are illustrated in the figures and are explained in more detail below.

Shown below.

DETAILED DESCRIPTION OF EXEMPLARY EMBODIMENTS

The same or similar components in different figures are provided with the same reference numerals.

FIG. 1 shows a cross-sectional view of an electronic assembly 100 according to an exemplary embodiment with a peripheral electronic device 110 and a flat package 120, shown here as a thin quad flat package (TQFP), which is mounted thereon. A thickness "l" of an encapsulated section of the package 100 is 1.5 mm, and a length "B" of the package 100 is 8 mm.

The electronic device 100 includes the peripheral electronic device 110, which is designed here as a PCB (Printed Circuit Board). The peripheral electronic device 110 has an electrically insulating core structure 114 (for example, a layer of FR4 material) and a plurality of electrical contacts 112 (for example, made of electrically conductive material such as copper), which cover a part of the surface of the electrically insulating core structure 114.

Furthermore, the electronic device 100 comprises the package 120, wherein each of the terminal pins 122 of the package 120 is designed here as a curved wire-shaped copper structure and the package 120 is electrically connected to one of the electrical contacts 112 of the peripheral electronic device 110 by a solder joint (see solder pattern 150).

The package 120 has one or more (here, two is configured as a semiconductor chip) electronic chips 124, and an encapsulation body 138 that completely encapsulates the one or more electronic chip(s) 124. The plurality of terminal pins 122 connect the one or more electronic chip(s) 124 to the electrical contacts 112 of the peripheral electronic device 110 in an electrically conductive manner. The electronic chips 124 are mounted directly or indirectly on a lead frame 148 and are electrically connected to the terminal pins 122 using encapsulated bonding wires 152 as well.

Each of the terminal pins 122 comprises a section 126, encapsulated by the encapsulation body 138, and a substantially C-shaped exposed section 128 that protrudes from the encapsulation body 138, that is, not covered by the material of the encapsulation body 138. The exposed sections 128 extend from one side wall 134 of the encapsulation body 138 laterally outwardly to a reversal point 130 (that is, a laterally outermost point of the terminal pins 122) and extend laterally from the reversal point 130 inwardly back towards the encapsulation body 138, so that a free end 132 of the exposed sections 128 is laterally spaced outwardly by a distance "d" with respect to the outermost position of the associated side wall 134 of the encapsulation body 138. In other words, the free ends 132 of the exposed sections 128 of terminal pins 122 end at a lateral position further outside than the outermost position of the side walls 134 so that a gap "d" remains on all sides when the package 120 is viewed from the top. According to FIG. 1, the lateral direction is the horizontal direction.

Furthermore, the terminal pins 122 are configured such that the free end 132 of the exposed sections 128 is vertically spaced from a lower main surface 136 of the encapsulation body 138, see distance "D". An entire outer surface 140 of the exposed sections 128 that is turned away from the encapsulation body 138 is convex. An entire inner surface 142 of the exposed sections 128 that faces the encapsulation body 138 is concave.

As it can be seen from the illustration 160 in FIG. 1, a section 162 of the exposed sections 128 that extends laterally up to the reversal point 130, is aligned axially symmetric with respect to another section 164 of the exposed sections 128, while the other sections 164 extend laterally from the reversal point 130 back towards the encapsulation body 138. An associated axis of symmetry 144 is in a plane perpendicular to the paper plane of FIG. 1 and parallel to both opposed main surfaces 136, 146 of the encapsulation body 138.

In the following, the function of the above-described configuration of the terminal pin 122 is described with respect to an increase in the service life of the flat package 120 under the influence of thermal cycling in accordance with FIG. 1: The plastic material of, for example, molded encapsulation body 138 has a larger coefficient of thermal expansion than a material of the peripheral electronic device 110, in particular, than its main component in the form of electrically insulating core structure 110 made of FR4 material. If the electronic device 100 is exposed to thermal cycles, i.e. repeated (in particular, frequent and sudden) temperature increases (for example, when a user takes the electronic device 100 to a warm room) and temperature reduction (for example, when the user takes the electronic device 100 out of a building during winter), the different coefficients of thermal expansion, in particular, between the material of the encapsulation body 138 of the package 120 and the material of the electrically insulating core structure 114 of the peripheral electronic device 110 may lead to a slight shift in the position of an interface 199 of the terminal pins 122 at a transition between interior and an exterior of the encapsulation body 138. This can also be referred to as "Thermal Mismatch" that can subsequently lead to cracks and fractures in the solder pattern 150, and finally to a loosening of the terminal pins 122 of the peripheral electronic device 110.

In a conventional gull wing configuration of the terminal pins (see FIG. 2), the described effects of an enormous mechanical stress act on the solder pattern 150. In contrast, according to an exemplary embodiment of the substantially C-shaped configuration of the terminal pins 122 of FIG. 1 (and with the configurations shown in FIGS. 11 to 16 in a similar manner), increase in the effective beam length of the exposed sections 128 of the terminal pins 122 can be achieved (see FIG. 7), wherein the forces acting on the joint with the solder pattern 150 can be reduced significantly. With the C-shaped terminal pins 122, the horizontal length, and therefore, the connection area of the solder joint can be advantageously increased in synergy with this geometry. Therefore, using the C-shaped pins or terminal pins 122 may increase the thermal service life of the electronic device 100. In case of extending the connection between the terminal pins 122 and the solder pattern 150, it is clear that many more thermal cycles are required to weaken the connection by successive cracking.

Therefore, it allows the architecture of FIG. 1 to increase the thermal cycling service life of the flat package 120, without changing the outer dimension. This is based on the consideration that the geometrical parameters of the pin form are specially considered in order to reduce the stress on the solder joint. Other advantages of the C-shaped terminal pins 122 of FIG. 1 are that the terminal pins 122 become more flexible, the foot length of the pins can be increased without increasing the overall package dimensions, and a tensile stress that is otherwise destructive is advantageously replaced with a compressive stress.

As shown in FIG. 1, the respective free end 132 of the exposed sections 128 is closer to a peripheral electronic device 110, to which the package 120 is to be connected, than the remainder of the respective exposed section 128 between the respective free end 128 and the respective reversal point 130. As a result, the effective beam length can be extended very efficiently and the surface of a solder joint can be increased. This increases the stability even under extreme temperature variations. The free ends 132 of the exposed sections 128 are directed inwards and face each other. This helps in achieving a high effective beam length with a small area requirement. The exposed sections 128 are also continuously curved, and thus free from discontinuities and kinks. This provides for a good suspension and avoids mechanical weaknesses in a simple execution.

Figure 2:
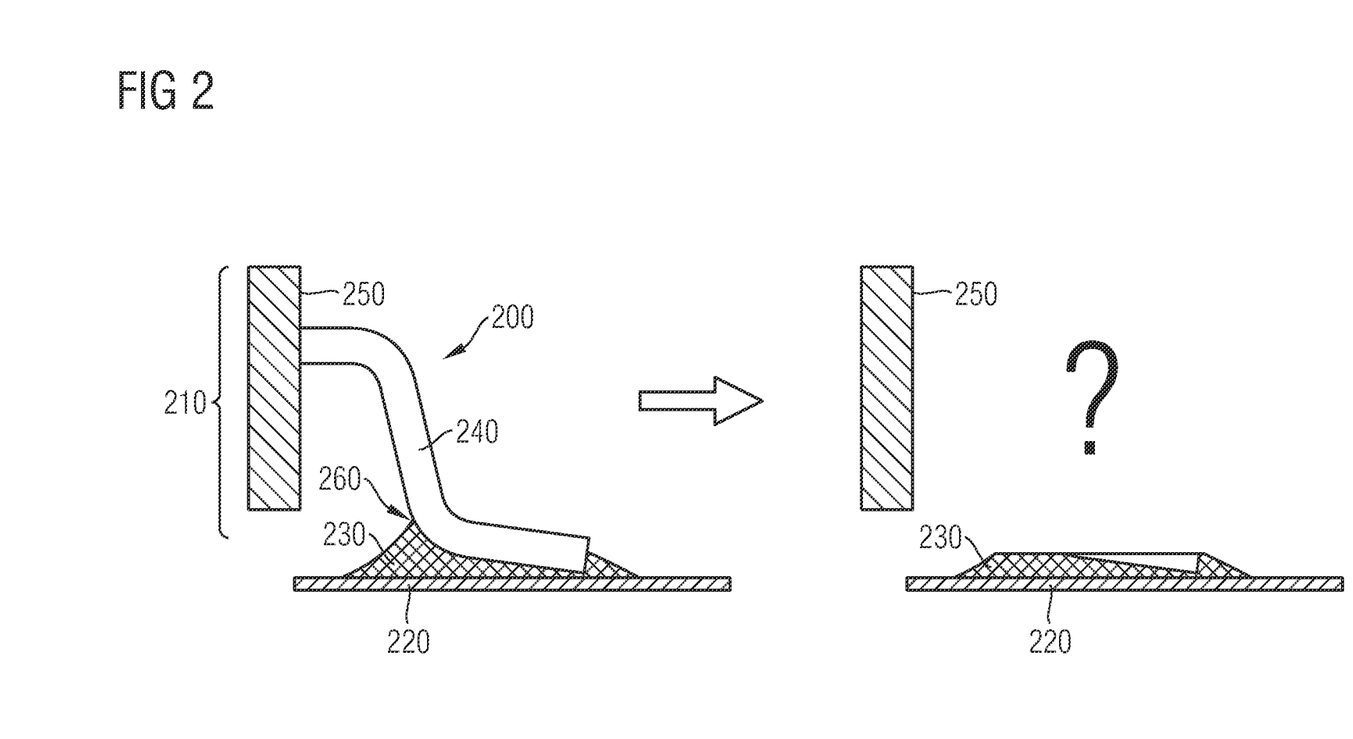
FIG. 2 shows a conventional package connection between an encapsulation body and a peripheral electronic device using terminal pins with a gull wing configuration for purpose of illustrating, based on which exemplary embodiments have been developed.

FIG. 2 shows a conventional transition between an encapsulation body 250 and a peripheral electronic device 220 using terminal pins 240 with a gull wing configuration for illustrating considerations, based on which exemplary embodiments have been developed.

FIG. 2 shows on the left side a conventional electronic device 200 in detail from a package 210 and the peripheral electronic device 220, which is connected to the package 210 via a solder pattern 230. To this end, gull-wing-shaped terminal pins 240 that are encapsulated partially within and partially outside the encapsulation body 250 are used. As shown schematically on the right side of FIG. 2, a challenge to be overcome by the exemplary embodiments is to modify the design of the terminal pins 240 such that the service life of the flat package 210 (e.g. a TQFP) can be increased during a thermal cycle, without changing the outer dimensions of the package 210. One finding of exemplary embodiments in this context is that the position of the greatest stress is often that which is indicated by the reference sign 260. Maximum mechanical stress occurs there.

Figure 3:
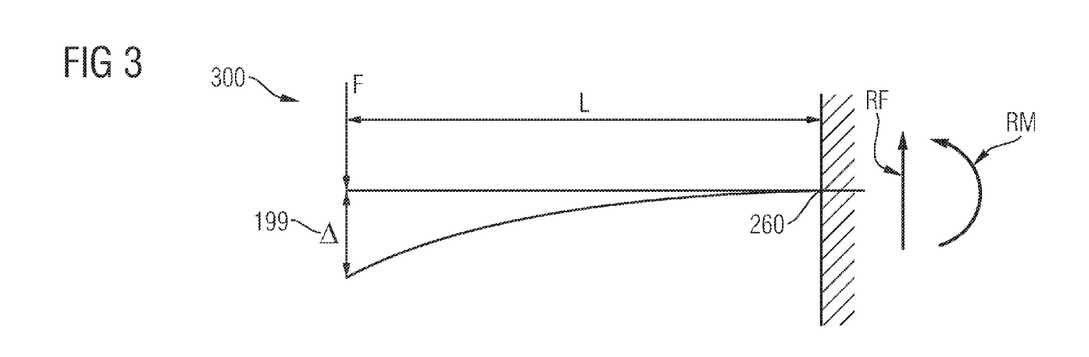
FIG. 3 shows a beam model to model forces acting on a terminal pin, which provides a coupling between an encapsulation body and a peripheral electronic device according to an exemplary embodiment.

FIG. 3 shows a beam model 300 to model forces acting on a terminal pin, which provides a transition between an encapsulation body and a peripheral electronic device.

The following formula (1) is used as the basis for the considerations listed in the following:

$$\Delta = F*L^3/(3*E*I_y) \tag{1}$$

In formula (1), $\Delta$ refers to a thermal mismatch at the position that is indicated in FIGS. 1 and 3 by the reference sign 199. This is regarded as a cause for the failure of conventional packages. In contrast, the position at which the mechanical damage occurs, is indicated in FIGS. 2 and 3 with the reference sign 260. Based on a simple beam theory, the terminal pin is modeled as a bar with an effective length L. F designates the force that acts on the terminal pin at the position that is marked with reference sign 199. In formula (1), E is the Young's modulus (which is indicative of a bending stiffness) and $I_y$ denotes the moment of inertia. Furthermore, as can be seen from FIG. 3, the scenario described leads to a shear force RF:

$$RF = F \sim \Delta/L^3 \tag{2}$$

and to a corresponding fixed-end moment RM:

$$RM = F*L \sim \Delta/L^2 \tag{3}$$

Thus, the reaction force RF and the reaction moment RM depend on the third or the second inverse power of the beam length L for a given shift $\Delta$ due to a mismatch of coefficients of thermal expansion. This means that any increase in the pin length L has a high impact on reducing the stress on the solder joint due to a lowering of the reaction force RF and the reaction moment RM. These considerations show that for a given value of $\Delta$, an increase of L leads to a strong reduction in the forces resulting at the location of the solder pattern.

Figure 4:
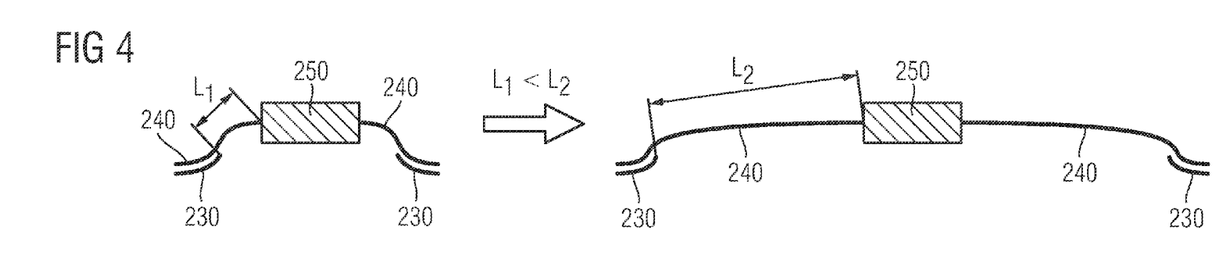
FIG. 4 is a consideration relating to an improvement of the stability by modifying terminal pins with a gull wing configuration, based on which the exemplary embodiments have been developed.

FIG. 4 is another consideration relating to an improvement of the stability by modifying terminal pins with a gull wing configuration, based on which the exemplary embodiments have been developed. Although improvement can be theoretically achieved by increasing the length $L_2$ with respect to $L_1$, while maintaining a gull wing configuration, a configuration like the one on the right side of FIG. 4 is practically disadvantageous because it requires a very large area. This is against the trend in the packaging technology to continuously reduce the dimensions.

Figure 5:
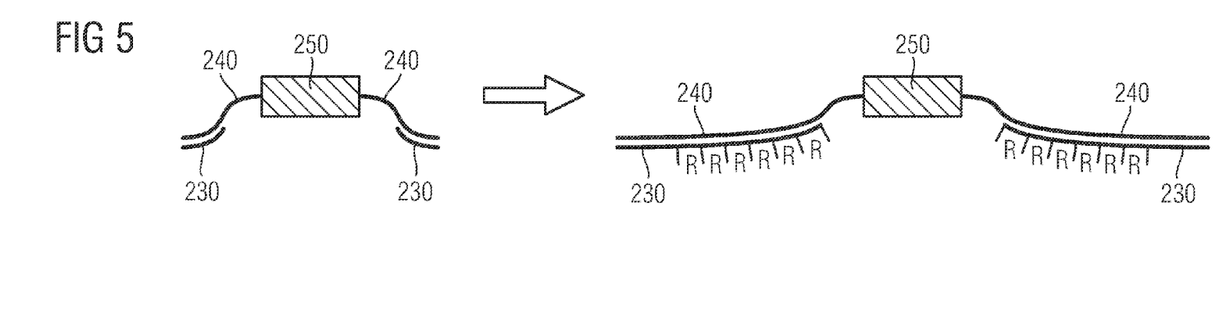
FIG. 5 is another analysis relating to an improvement of the stability by modifying terminal pins with a gull wing configuration, based on which the exemplary embodiments have been developed.

FIG. 5 is another consideration for an improvement of the stability by modifying terminal pins with a gull wing configuration, based on which the exemplary embodiments have been developed. The consideration of FIG. 5 shows that increasing the length of the solder joint will increase its service life because more thermal cycles are required to allow a crack to develop along a longer solder joint. In a very simple and rough consideration, one might assume that each thermal cycle leads to an increase in the length of a crack by a dimension R, as shown in FIG. 5.

Figure 6:
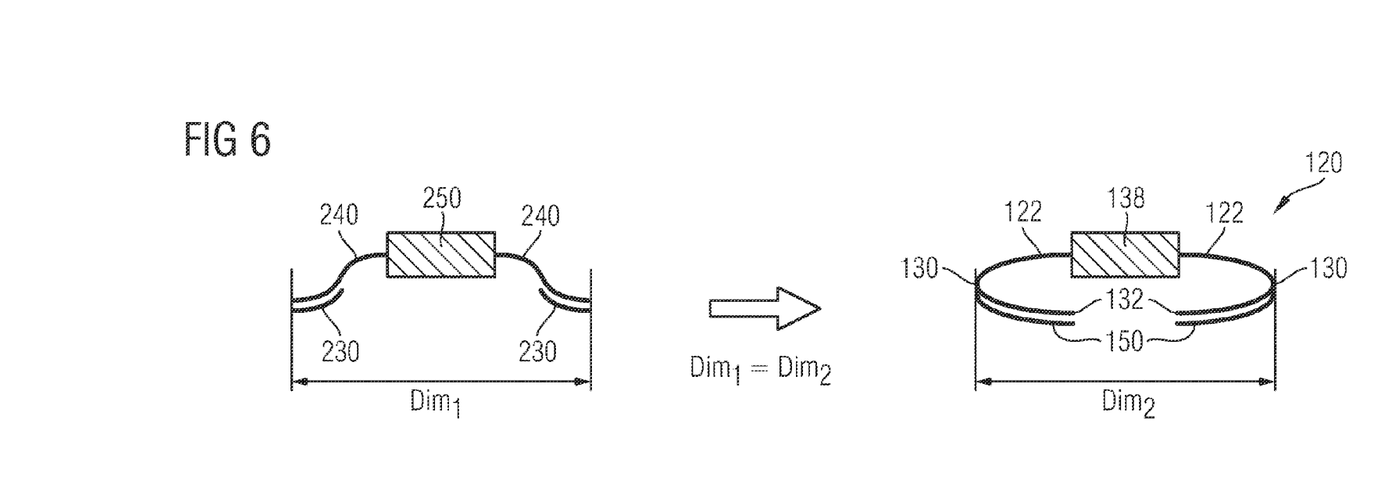
FIG. 6 shows yet another analysis relating to an improvement of the stability by modifying terminal pins with a gull wing configuration with terminal pins with a substantially C-shaped configuration according to an exemplary embodiment.
Figure 7:
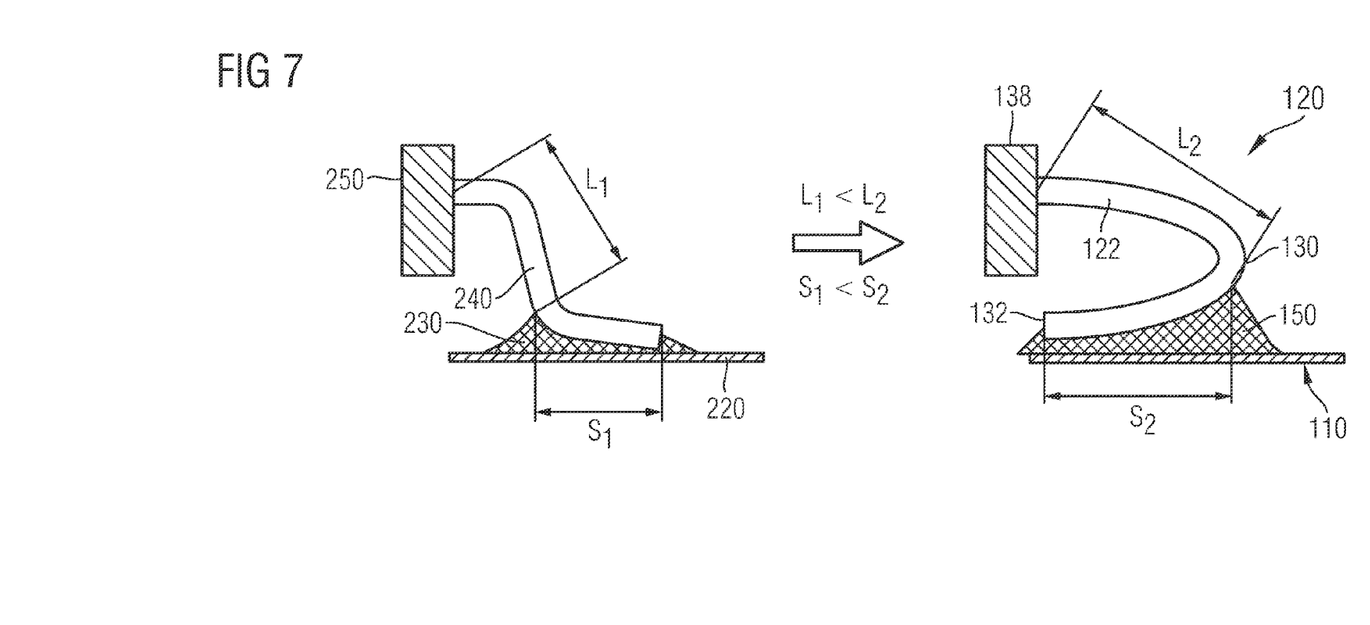
FIG. 7 shows a detailed view of portions of the illustration of FIG. 6.

FIG. 6 shows yet another consideration for improvement of the stability by modifying terminal pins with a gull wing configuration in terminal pins with a substantially C-shaped configuration according to an exemplary embodiment. FIG. 7 shows a detailed view of the selected features of FIG. 6.

FIGS. 6 and 7 illustrate schematically a main change to a terminal pin design that has been made in light of the above-mentioned and other considerations, based on exemplary embodiments.

By replacing the previously used gull-wing type terminal pins 240 with substantially C-shaped terminal pins 122 in accordance with an exemplary embodiment, the effective pin length can be significantly increased, for example approximately doubled. The reaction moment RM is then reduced by a factor of four, and the reaction force RF by a factor of eight ($L_1 < L_2$). Furthermore, the use of C-shaped pins offers the opportunity to use a larger longitudinal area of the pins for a soldered joint. This allows an approximate doubling of the solder joint length ($S_1 < S_2$). These two effects can jointly increase the life of the solder joint dramatically, while the overall dimensions of the packages remain the same.

Figure 8:
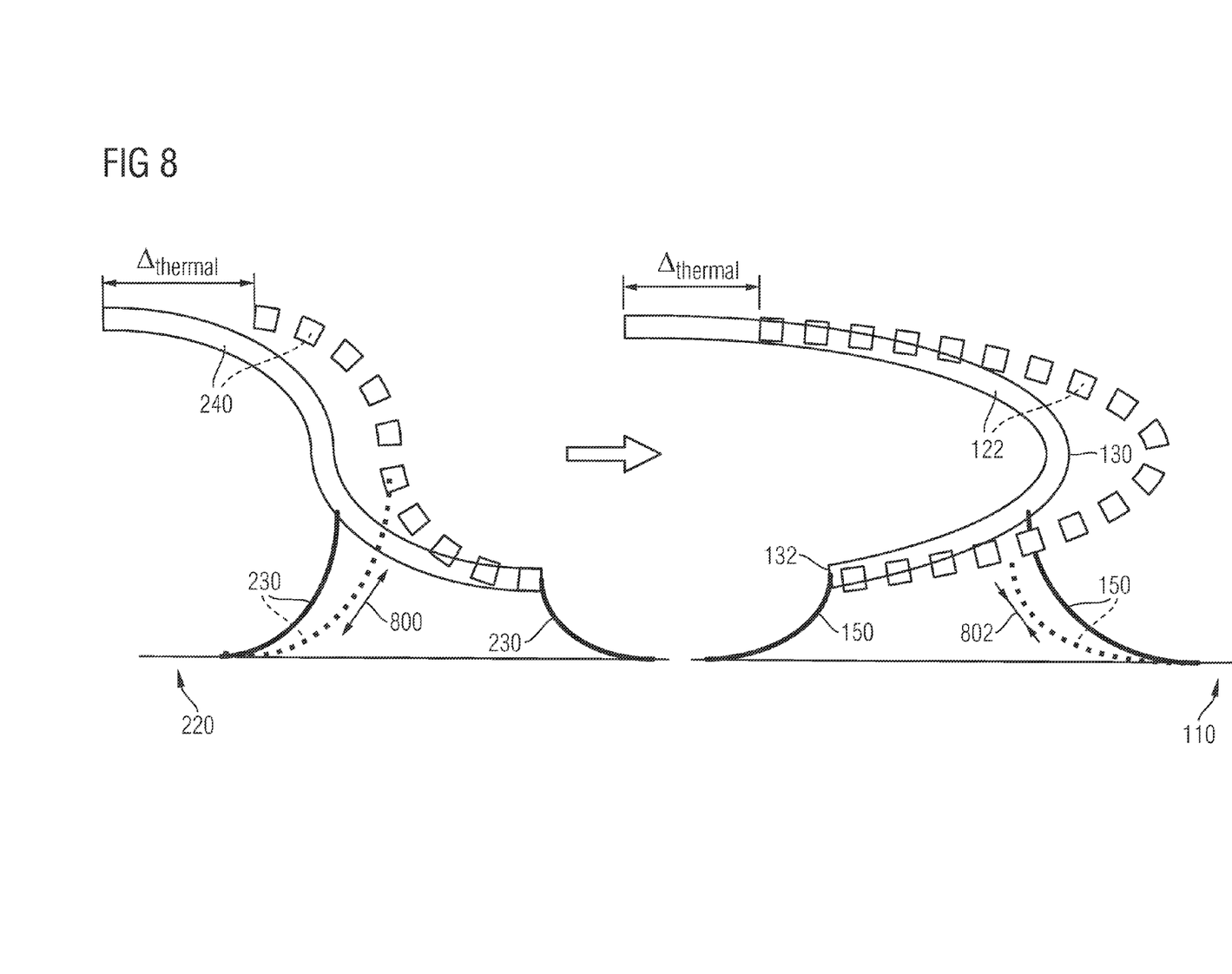
FIG. 8 shows yet another consideration relating to an improvement of the stability by modifying terminal pins with a gull wing configuration in terminal pins with a substantially C-shaped configuration according to an exemplary embodiment.

FIG. 8 shows yet another consideration relating to an improvement of the stability by modifying terminal pins 240 with a gull wing configuration in terminal pins 122 with a substantially C-shaped configuration according to an exemplary embodiment.

FIG. 8 illustrates an additional advantage of providing a C-shaped pin. A C-shaped pin completely alters the mechanism of stress at the solder joint. It converts a conventionally occurring destructive tensile stress, see reference sign 800, into an advantageous compressive stress that can be achieved according to an exemplary embodiment, see reference sign 802. This effect also reduces the service life of the solder joint dramatically. This advantageous effect is particularly pronounced if the coefficient of thermal expansion of the encapsulation body (for example, a mold compound) is greater than that of the peripheral electronic device (for example, a printed circuit board).

Figure 9A:
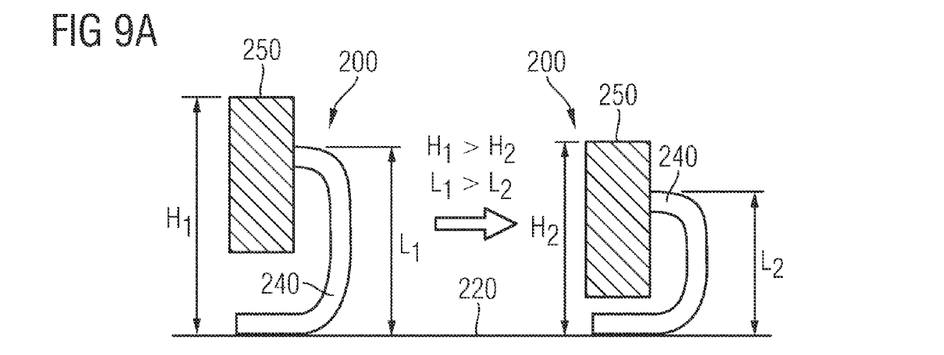
FIG. 9A shows another analysis concerning pins with a J-shaped configuration.
Figure 9B:
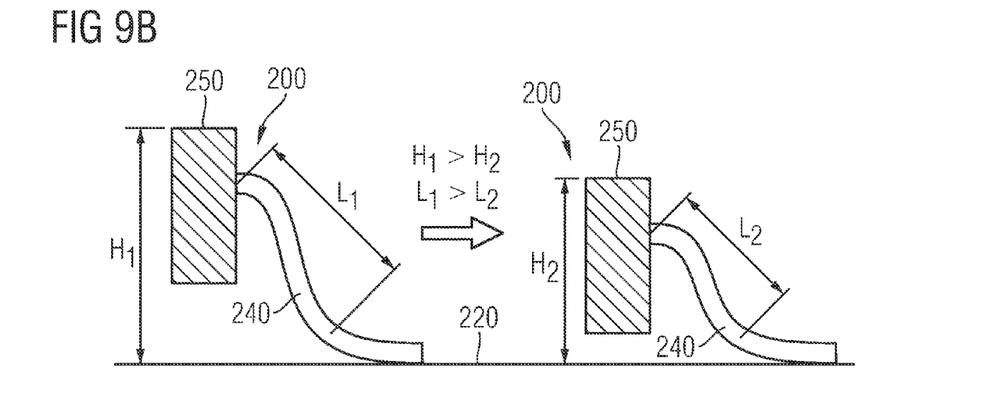
FIG. 9B shows another analysis concerning pins with a gull wing configuration.
Figure 10:
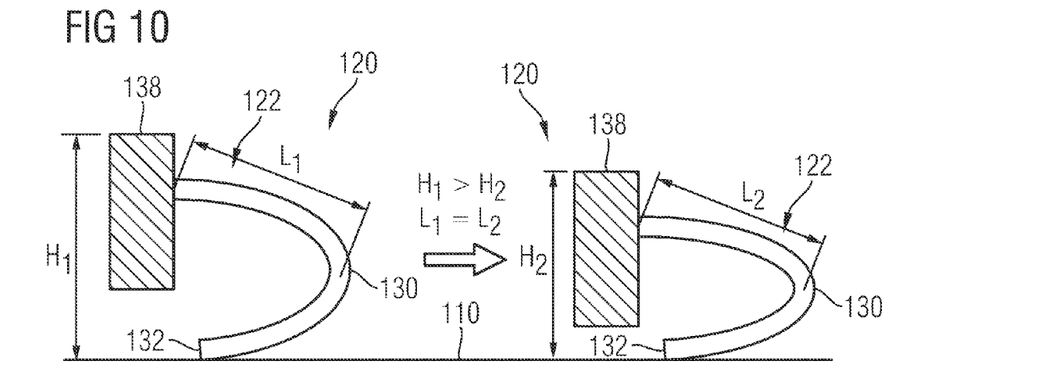
FIG. 10 shows a package in detail according to an exemplary embodiment, wherein the details show that a reduction in the total height of a package without substantially reducing the length of the terminal pins is possible according to exemplary embodiments.

FIGS. 9A and 9B show the effects of reducing the height of a package 200 in conventional terminal pins 240. FIG. 10 shows the effects of reducing the height of a package 120 with a terminal pin 122 according to an exemplary embodiment. This is a transition from a larger-sized package 200 or 120 to a lower-sized package 200 or 120 according to FIGS. 9A, 9B and 10 from left to right (see arrow).

FIG. 9A shows a corresponding consideration in accordance with the terminal pins with a J-shaped configuration.

Flat packages using the SOJ technology, such as the one shown in FIG. 9A, can have substantially J-shaped pins 240, which can directly contact a lower surface of the encapsulation body 250 (not shown). However, as can be seen from FIG. 9A, this configuration results in a dramatic reduction in the service life of the package during thermal stress, because the effective pin length is proportional to the package height (L is proportional to H). Therefore, the J-shaped pins 240 as configured in FIG. 9A with an extension below the underside of the encapsulation body 250, are not suitable for increasing the thermal service life.

For a conventional J-shaped terminal pin 240 according to FIG. 9A, whose free end extends up to the bottom of the encapsulation body 250, the compact design (i.e. transition to a flatter package) leads to a reduction in the effective length of the terminal pins 240 ($L_1 < L_2$), and therefore, under thermal stress, to a dramatic reduction in the service life of the package 200. With continued reduction in the height of the package, this effect is more pronounced (H≈L). FIG. 9B shows that this correspondingly applies to a conventional terminal pin 240 with gull wing configuration.

FIG. 10 shows a package 120 in detail according to an exemplary embodiment.

In contrast to the pin forms shown in FIGS. 9A and 9B, using substantially C-shaped terminal pins 122 according to an exemplary embodiment, as shown in FIG. 10, may be accompanied by a reduction in the height of the package 120, without the service life of the package 120 being reduced under thermal stress.

Based on FIG. 10, it can be seen that according to exemplary embodiments, reduction in the total height of a package 120 (corresponding to a transition from left to right according to FIG. 10) is possible without a significant reduction in the effective length L of the terminal pins. FIG. 10 shows that the reduction in the total height of the package 120 does not lead to any noticeable reduction in pin length. This is an advantage of the C-shape. In conventional forms of a terminal pin, the pin length is reduced upon reduction in the total height of a package, which means a non-linear increase in the stresses at the solder joint. It is very advantageous that this can be avoided according to exemplary embodiments, if increasingly flatter packages 120 are to be produced. On the right side of FIG. 10, it is shown that according to an exemplary embodiment, a package 120 may include a terminal pin 122, whose free end 132 ends almost at the level of the encapsulation body 138 (can be arranged, in particular, near or even above the lower main surface 136), laterally spaced from the side wall 134.

As shown in FIG. 10, the terminal pins 122 are configured such that a vertical distance between the part of the exposed sections that laterally extends from the encapsulation body 138 up to the reversal point 130 and the other section that laterally extends from the reversal point 130 back towards the encapsulation body 138 can be reduced if a more compact design is preferred. As shown in FIG. 10, the flat and compact configuration on the right side of FIG. 10 can be obtained since the free end 132 remains laterally adjacent to and spaced from the encapsulation body 138. With the shown C-shaped pins, the package height can be reduced without affecting the thermal cycling on board performance.

FIGS. 11 to 16 show cross-sectional views of packages 120 with terminal pins 122 with different designs according to exemplary embodiments.

Figure 11:
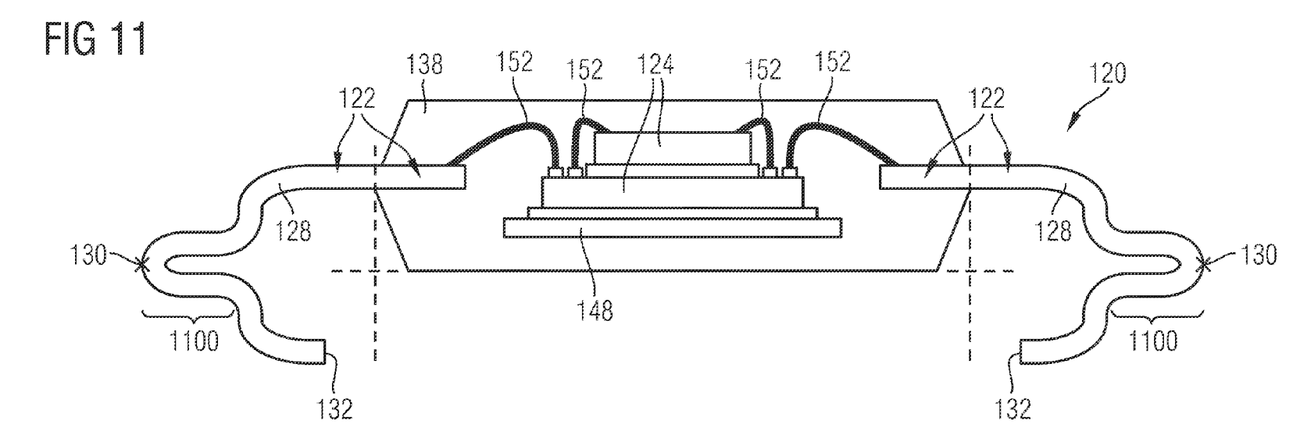
FIGS. 11 to 16 show cross-sectional views of packages with terminal pins with different shapes according to exemplary embodiments.

The package 120, which is shown in FIG. 11, differs from the package 120 shown in FIG. 1, in particular, in that the exposed sections 128 of the terminal pins 122 have a central, substantially U-shaped protrusion 1100 in addition to the substantially C-shaped section.

Figure 12:
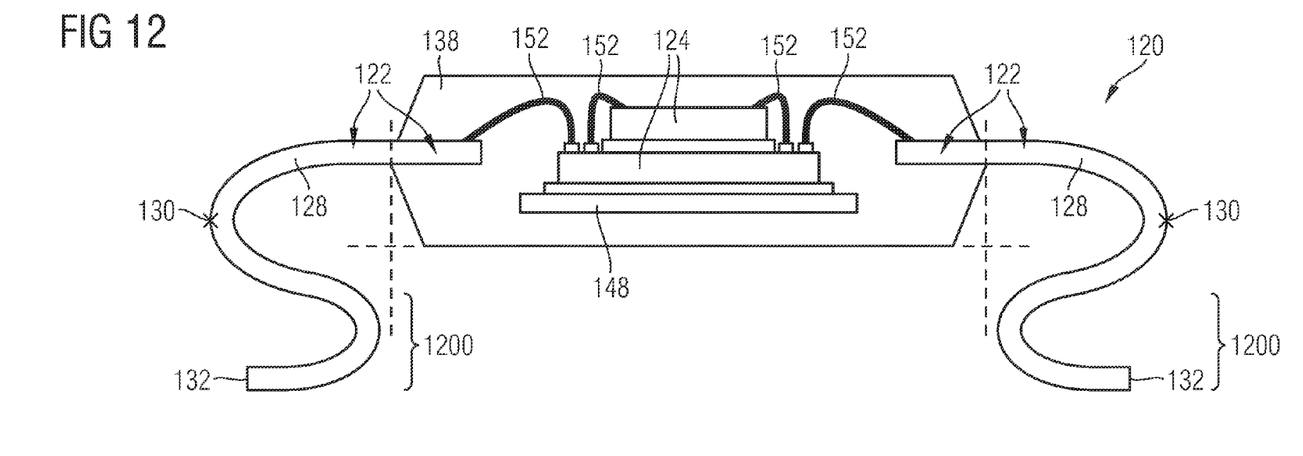

The package 120, which is shown in FIG. 12, differs from the package 120 shown in FIG. 1, in particular, in that the exposed sections 128 of the terminal pins have a protrusion 1200 in addition to the substantially C-shape, which leads to an S-form on the whole.

Figure 13:
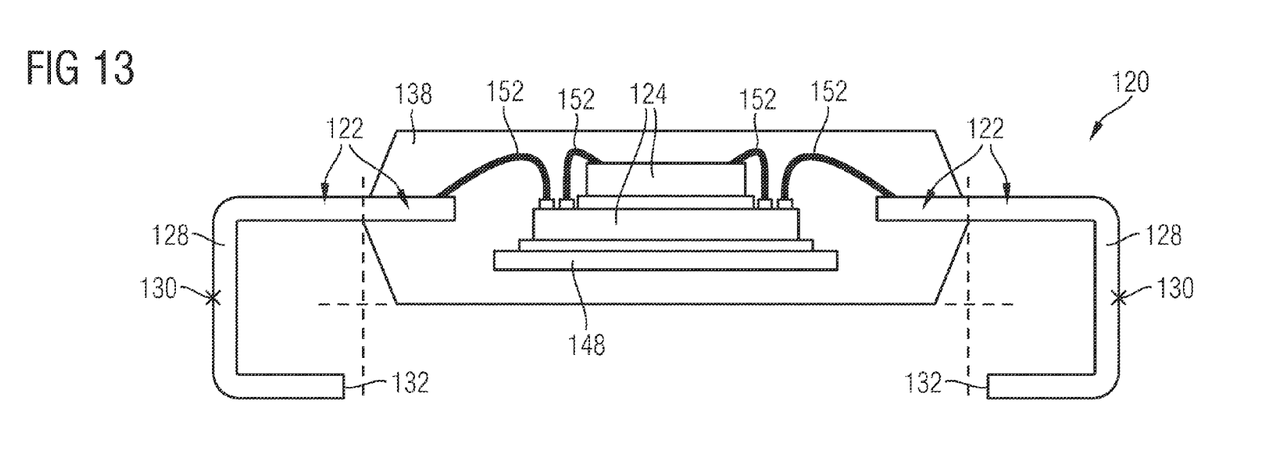

The package 120, which is shown in FIG. 13, differs from the package 120 shown in FIG. 1, in particular, in that the exposed sections 128 of the terminal pins 122 also have a substantially C-shape, which is made of three perpendicularly arranged legs.

Figure 14:
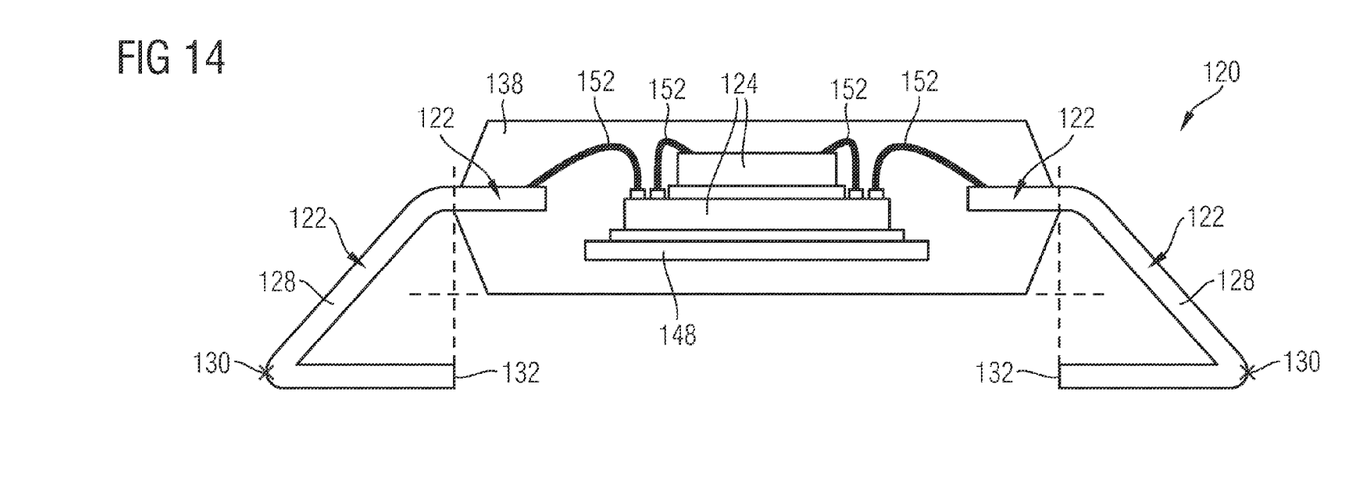

The package 120 shown in FIG. 14 differs from the package 120 shown in FIG. 1, in particular, in that the exposed sections 128 of the terminal pins 122 have an inclined or angled shape with a substantially C-shaped design.

Figure 15:
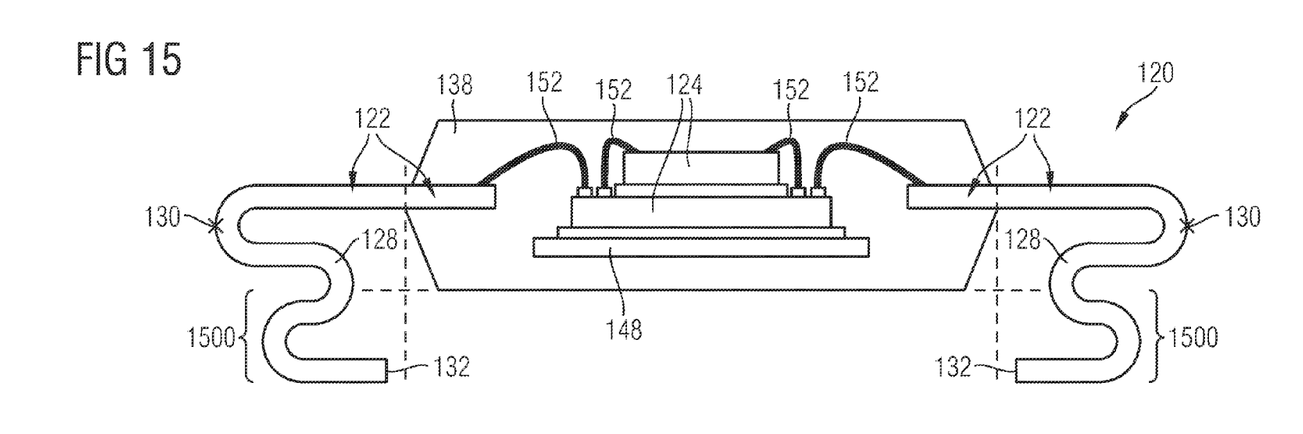

The package 120 shown in FIG. 15 differs from the package shown in FIG. 1, in particular, in that the exposed sections 128 of the terminal pins 122 have a substantially S-shaped extension 1500 in a lower section in addition to the section with a substantial C-shape.

Figure 16:
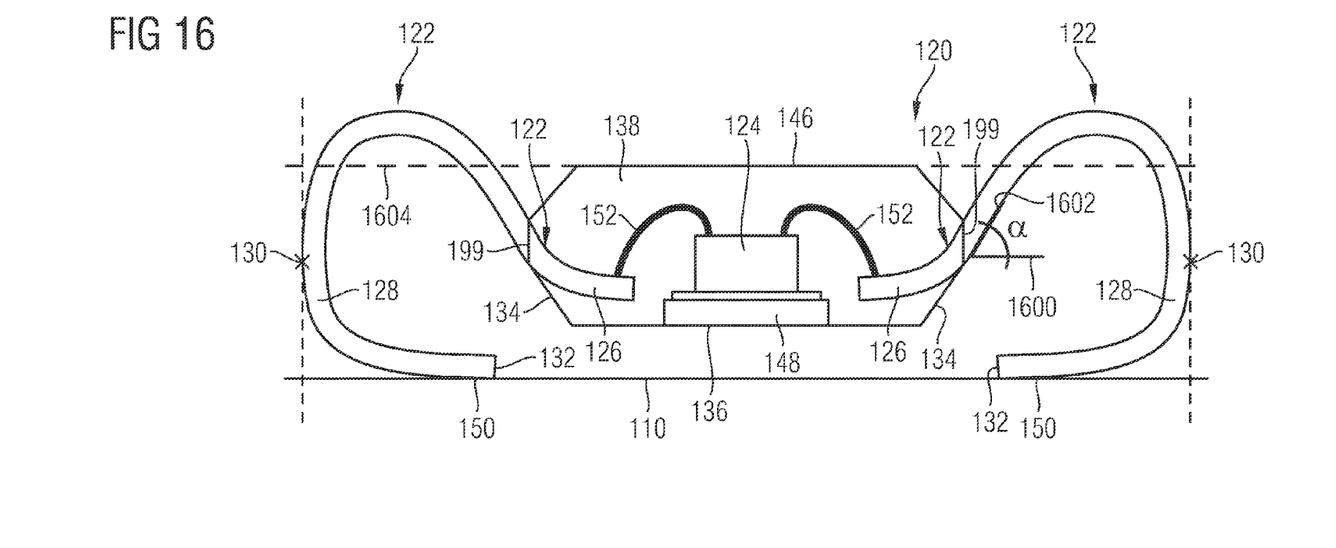

The package 120 shown in FIG. 16 differs from the package 120 shown in FIG. 1, in particular, in that an angle α, which is not equal to zero and can be, in particular, narrow, is formed at the interface 199, at which the terminal pin 122 emerges from the encapsulation body 138, at the terminal pin 122 between a horizontal direction 1600 and a tangent 1602. Furthermore, as shown by example in FIG. 16, the terminal pin 122 may also extend vertically beyond an upper primary plane 146 of the encapsulation body 138. This is schematically indicated by a line of sight 1604 that protrudes from a section of the terminal pin 122. The package 120 shown in FIG. 16 has an advantageous design of the terminal pin 122 to achieve high stability against thermal heating and cooling cycles.

Furthermore, FIG. 16 shows a package 120 with the so-called "exposed pad" structure, i.e. with pad(s) that are exposed on the lower side opposite the encapsulation body 138. Each of the exemplary embodiments shown may be executed with a "non-exposed pad" structure (for example, see FIG. 1) or an "exposed pad" structure. According to FIG. 16, the pin shape shown will bring about significant improvement in the service life.

Although only a single electronic chip 124 is shown in the inside of the encapsulation body 138 of the package 120 according to FIG. 16, it is, of course, possible that two or more electronic chips 124 are encapsulated in the encapsulation body 138 even in this exemplary embodiment.

A person skilled in the art of packaging will understand that many geometric alternatives to the embodiments of FIGS. 1 and 11 up to FIG. 16 are possible if the above and other considerations are applied.

It should also be noted that "comprising" does not exclude other elements or steps and "one" does not exclude plurality. It should also be pointed out that features or steps, which have been described with reference to one of the above embodiments, can also be used in combination with other features or steps of other exemplary embodiments described above. Reference signs in the claims are not to be considered as limiting.

The invention claimed is:

1. A package, wherein the package comprises:
at least one electronic chip;
an encapsulation body that at least partially encapsulates the at least one electronic chip;
a plurality of terminal pins to connect the at least one electronic chip, wherein each of the said terminal pins comprises an encapsulated section that is encapsulated by the encapsulation body, and an exposed section that protrudes from the encapsulation body;
wherein at least a part of the exposed sections extends laterally from the encapsulation body up to a reversal point and extends back laterally from the reversal point towards the encapsulation body, so that a free end of the exposed sections is laterally aligned with a corresponding side wall of the encapsulation body, or is spaced from the corresponding side wall of the encapsulation body laterally outwardly;

wherein the exposed sections are continuously curved, in particular kinkfree.

2. The package according to claim 1, wherein the terminal pins are configured such that the free end of the exposed sections is spaced vertically with respect to an adjacent main surface of the encapsulation body.

3. The package according to claim 1, wherein an entire outer surface of the exposed sections, which is turned away from the encapsulation body is convex.

4. The package according to claim 1, wherein the terminal pins are configured such that a vertical distance between the section of the exposed sections extending from the encapsulation body and the remaining section that extends from the reversal point that laterally extends back to the encapsulation body is reduced by exerting a compressive force when mounting the package on a peripheral electronic device.

5. The package according to claim 1, wherein a portion of the exposed sections, which laterally extends up to the reversal point, with respect to an axis of symmetry is axially symmetric with respect to a different portion of the exposed sections, which laterally extends from the reversal point back into the direction of the encapsulation body, wherein the axis of symmetry is in a plane, which is parallel to opposite main surfaces of the encapsulation body.

6. The package according to claim 1, wherein at least a portion of the exposed sections is substantially C-shaped.

7. The package according to claim 1, wherein at least a part of the exposed sections extends from the lateral side wall of the encapsulation body.

8. The package according to claim 1, wherein the exposed sections of the terminal pins extend from all four lateral sides of the encapsulation body beyond the encapsulation body.

9. The package according to claim 1, wherein a ratio between a lateral extension of the package and a thickness of the package is greater than five, in particular, greater than nine.

10. The package according to claim 1, wherein the package is configured as a flat package, and in particular, as a quad flat package.

11. The package according to claim 1, wherein a thickness of the package is less than 1.7 mm.

12. The package according to claim 1, wherein the terminal pins have a shape selected from a group consisting of a bent wire and a bent tape.

13. The package according to claim 1 wherein the at least one electronic chip is mounted on a chip carrier, in particular, a lead frame.

14. The package according to claim 1, wherein the at least one electronic chip is electrically connected to the terminal pins using bonding wires.

15. The package according to claim 1, wherein the plurality of terminal pins are formed to connect the at least one electronic chip to a peripheral electronic device.

16. The package according to claim 1, wherein the respective free end of the exposed sections is closer to a peripheral electronic device, to which the package is to be connected, than the remainder of the respective exposed section between the respective free end and the respective reversal point.

17. The package according to claim 1, wherein the free ends of the exposed sections are directed inwardly, in particular, facing one another.

18. An electronic assembly, wherein the electronic assembly comprises:
    a peripheral electronic device, comprising a plurality of electrical contacts; and
    a package according to claim 1;
    wherein at least a part of the terminal pins of the package is electrically connected to a respective one of the electrical contacts of the peripheral electronic device.

19. The arrangement according to claim 18, wherein areas of the exposed sections that are turned away from the encapsulation body are soldered to the electrical contacts.

20. The arrangement according to claim 18, wherein the peripheral electronic device is configured as a printed circuit board.

21. The arrangement according to claim 18, wherein a material of the encapsulation body has a larger coefficient of thermal expansion than a material of the peripheral electronic device.

22. Method for producing a package, wherein the method comprises:
    connecting a plurality of terminal pins to at least one electronic chip;
    at least partial encapsulating of the at least one electronic chip and partial encapsulating of the terminal pins by an encapsulation body such that each of the terminal pins comprises an encapsulated section that is encapsulated by the encapsulation body, and an exposed section extending beyond the encapsulation body;
    configuring at least a part of the exposed sections such that these extend laterally from the encapsulation body up to a reversal point and from the reversal point laterally back to the encapsulation body, so that a free end of the exposed sections is laterally aligned with an associated side wall of the encapsulation body, or is laterally outwardly spaced from an associated side wall of the encapsulation body;
    wherein the exposed sections are continuously curved, in particular kinkfree.

23. Method according to claim 22, wherein the plurality of terminal pins are formed for electrically contacting the at least one electronic chip to a peripheral electronic device.

* * * * *